United States Patent [19]

Khan et al.

[11] 4,412,342

[45] Oct. 25, 1983

[54] CLOCK SYNCHRONIZATION SYSTEM

[75] Inventors: Ashfaq R. Khan, Glendale Heights; Ivan L. Edwards, Downers Grove, both of Ill.

[73] Assignee: GTE Automatic Electric Labs Inc., Northlake, Ill.

[21] Appl. No.: 332,137

[22] Filed: Dec. 18, 1981

[51] Int. Cl.³ ............................................. H03K 1/17
[52] U.S. Cl. .................................... 375/107; 375/108; 307/219; 307/480
[58] Field of Search ................. 375/58, 103, 107, 108; 307/219, 480, 272 R, 272 A; 328/61, 103, 104; 371/8, 61, 68

[56] References Cited

U.S. PATENT DOCUMENTS

| | | |
|---|---|---|
| 4,019,143 | 4/1977 | Fallon et al. .......................... 307/219 |
| 4,156,200 | 5/1979 | Gomez ................................. 307/219 |
| 4,282,493 | 8/1981 | Moreau ................................ 307/219 |

Primary Examiner—Robert L. Griffin
Assistant Examiner—Stephen Chin
Attorney, Agent, or Firm—Gregory G. Hendricks; Robert J. Black

[57] ABSTRACT

A clock synchronization system for use in a digital switching system including multiple clock circuits. This circuit includes multiple synchronization circuits connected in a master-slave arrangement. Each synchronization circuit includes a counter chain which provides a periodic system framing pulse and a trigger circuit which insures that its slave system framing pulse is in synchronization with the master system framing pulse.

12 Claims, 3 Drawing Figures

CLOCK SYNCHRONIZATION SYSTEM

BACKGROUND OF THE INVENTION

(1) FIELD OF THE INVENTION

The present invention relates to clock circuits and more particularly to a synchronization system for use in a digital switching system including multiple clock circuits.

(2) DESCRIPTION OF THE PRIOR ART

Clock synchronization circuits are old and well known. Typically such synchronization circuits operate as phase locked loop circuits. These circuits, however, require complex logic circuitry and the complexity increases with the accuracy required.

Accordingly it is the object of the present invention to provide a synchronization system which can reduce the phase difference of signals from phase locked loop clock circuits without the requirement of the more complex phase locked loop circuitry used in prior art systems.

SUMMARY OF THE INVENTION

The present invention is a clock synchronization system for use in a digital switching system with multiple clock circuits connected in a master-slave arrangement. This sytem reduces the phase difference between the associated clock circuits to less than 80 nanoseconds through use of digital techniques rather than a phase locked loop.

The present invention includes a plurality of clock synchronization circuits, each connected to an associated clock circuit. The switching system includes a configuration control circuit which designates one of the clocks as a master clock and the other clocks as slave clocks. Each clock synchronization circuit can be operated as a master or slave circuit under the control of the configuration control circuit.

If a synchronization circuit is operated in the master mode, a counter chain divides the frequency of a connected clock circuit by a predetermined count to derive a system framing pulse for use by the digital switching system. However, if a clock synchronization circuit is operating in the slave mode, it then synchronizes its system framing pulse to the system framing pulse of the clock synchronization circuit designated to be operating in the master mode.

Under this slave mode of operation, the counter chain still derives a system framing pulse by dividing the associated clock frequency by a predetermined number. However the counter chain is controlled by a trigger circuit which operates in response to the system framing pulse of the master clock synchronization circuit. This trigger circuit provides a counter loading signal upon detection of the system framing pulse from the master clock synchronization circuit. The counter responds to this to this loading pulse by providing the slave system framing pulse within 80 nanoseconds of the master system framing pulse.

DESCRIPTION OF THE PREFERRED EMBODIMENT

Figure 1:
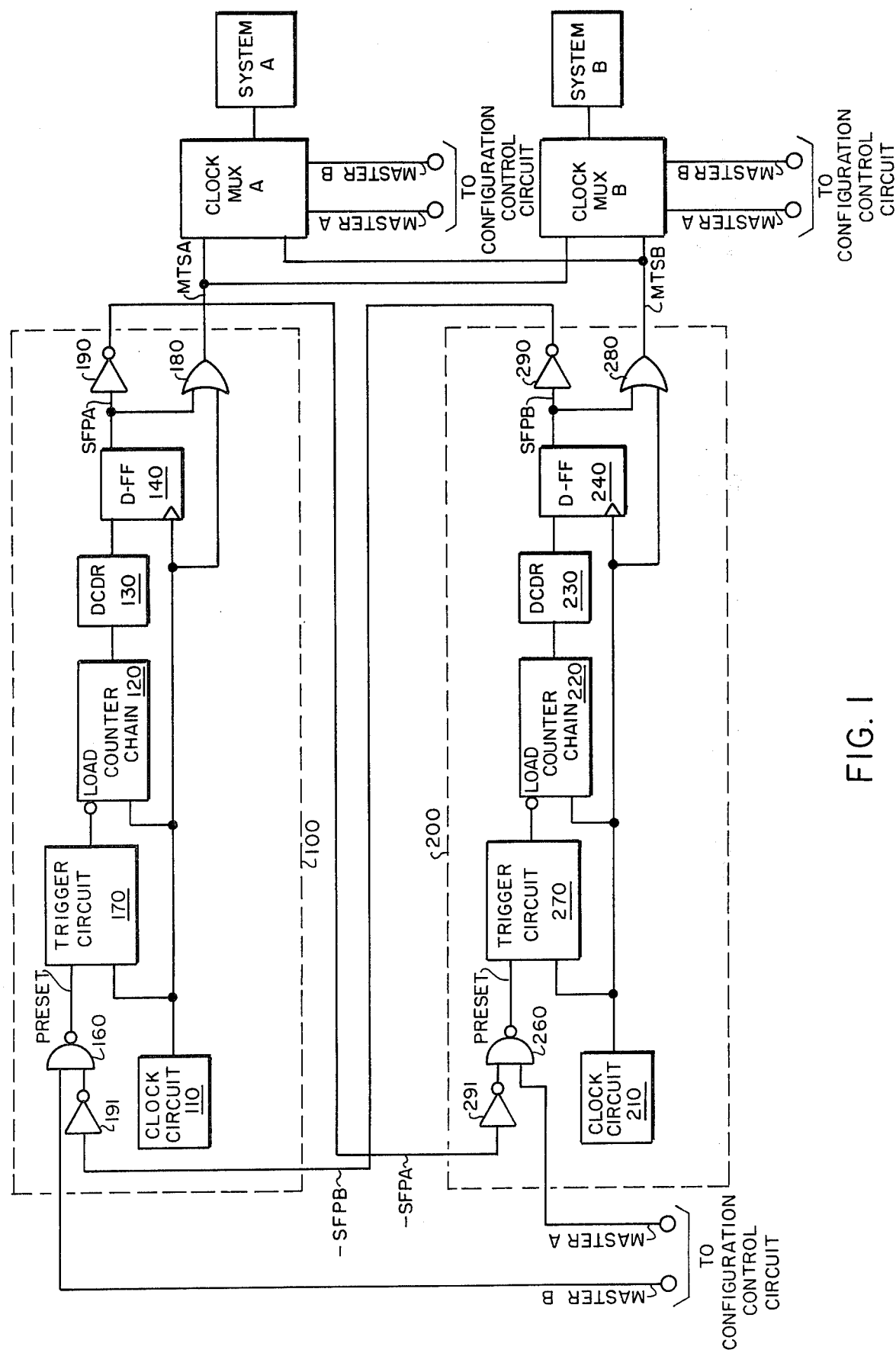
FIG. 1 is a combination block and logic diagram of a clock synchronization system in accordance with the present invention.

Referring now to FIG. 1, the clock synchronization system of the present invention is shown. This system includes clock synchronization circuit 100 and clock synchronization circuit 200 connected to swiching systems A and B via clock multiplexers A and B, respectively.

Clock synchronization circuit 100 derives a system framing pulse, SFPA, directly from clock circuit 110 when clock circuit 110 is operating as the master clock. However, clock synchronization circuit 110 also provides system framing pulse SFPA when clock circuit 210 is operating as the master clock. With this arrangement, clock synchronization circuit 200 derives its system framing pulse, SFPB, directly from clock circuit 210. Since clock circuit 210 is then the master clock circuit, clock synchronization circuit 100 is operating as a slave circuit. It therefore derives system framing pulse SFPA from system framing pulse SFPB of clock synchronization circuit 200. Similarly, when clock circuit 110 is operating as the master clock, clock synchronization circuit 200 derives system framing pulse SFPB from system framing pulse SFPA of clock synchronization circuit 100.

Clock synchronization circuit 100 includes clock circuit 110 connected to divide-by-1544 counter chain 120, D-type flip-flop 140, gate 180, and trigger circuit 170. Counter chain 120 is connected between trigger circuit 170 and decoder 130 which is connected to D-type flip-flop 140. This flip-flop is further connected to inverter 190 which is connected to clock synchronization circuit 200. Gate 160 is connected between trigger circuit 170 and a configuration control circuit. This gate is also connected to clock synchronization circuit 200 via inverter 191. Clock synchronization circuit 100 is connected via gate 180 to clock multiplexers A and B which are connected to switching systems A and B, respectively. Clock synchronization circuit 200 contains circuitry identical to that of clock synchronization circuit 100 and is connected via gate 280 to clock multiplexers A and B.

When clock circuit 110 is operating as a master clock circuit, the configuration control circuit applies a logic level 0, master B signal to gate circuit 160. This results in a logic level 1 signal being applied to the preset input of trigger circuit 170. This trigger circuit then applies a logic level 1 signal to the load input of divide-by-1544 counter chain 120. This logic level 1 signal has no effect on counter chain 120.

Figure 3:
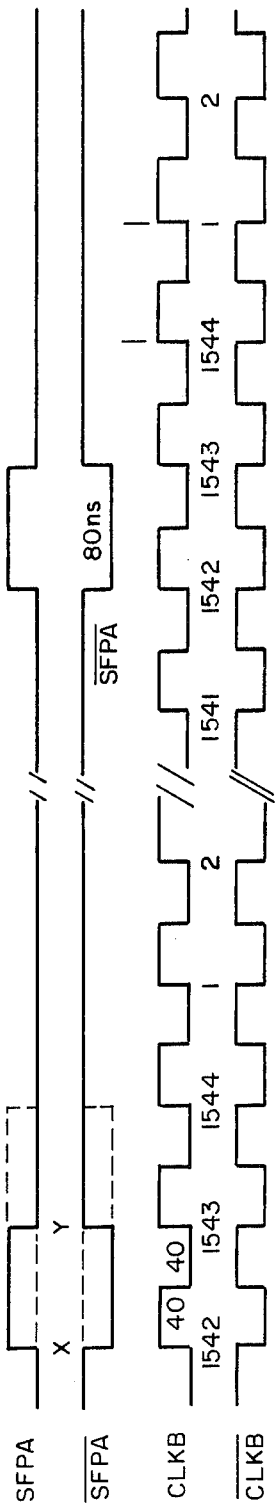
FIG. 3 is a timing diagram in accordance with the present invention.
Figure 3:
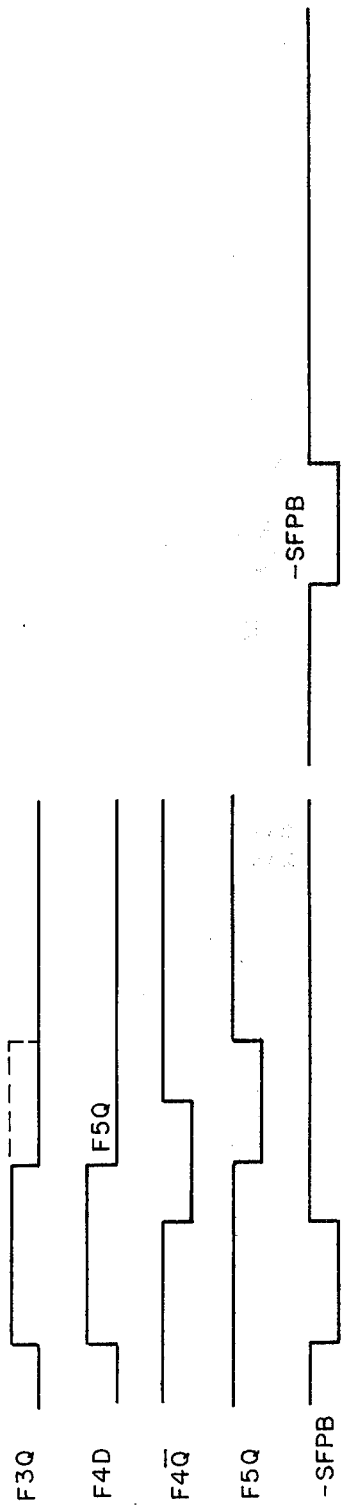

Clock circuits 110 and 210 are phase locked loop clock circuits with a 200 nanosecond phase difference. These clock circuits provide clock signals CLKA and CLKB, respectively, each of which has a 12.352 MHz frequency with an 80 nanosecond periodand a 50% duty cycle. The waveform for clock signal CLKB is shown in FIG. 3. Clock signal CLKA drives divide-by-1544 counter chain 120. This counter chain repeatedly counts from 1 to 1544 and its output signals are decoded by decoder 130. Upon detection of a count of 1542 decoder 130 applies a logic level 1 signal to D-type flip-flop 140. On the next rising edge of a CLKA signal, flip-flop 140 provides a logic level 1 signal and on the next subsequent rising edge of the CLKA signal flip-flop 140 is again clocked. However, at this time decoder 130 is no longer decoding a count of 1542 and it therefore applies a logic level 0 signal to the D input of this flip-flop. Flip-flop 140 then provides a logic level 0 signal at its output.

Since successive rising edges of CLKA signals occur 80 nanoseconds apart, flip-flop 140 provides a system framing pulse, SFPA, having a pulse width of 80 nanoseconds. This pulse occurs once every 125 microseconds (8 KHz) because it occurs only once during each complete counter cycle. Since 1544 clock pulses are counted in each counter cycle, counter chain 120 divides the 12.352 MHz CLKB signal by 1544, thereby providing the 8 KHz signal with the resultant 125 microsecond period.

System framing pulse SFPA is then combined with the CLKA signal by OR gate 180 thereby providing a 12.352 MHz master timing signal, MTSA with an 80 nanosecond SFPA signal once every 125 microseconds.

Since clock circuit 110 is designated to be the master clock, clock synchronization circuit 200 must derive its system framing pulse, SFPB, from system framing pulse SFPA of clock synchronization circuit 100. The configuration control circuit therefore applies a logic level 1 master A signal to gate 260. When system framing pulse SFPA from clock circuit 100 also appears at the input to gate 260, a logic level 0 signal is applied to the preset input of trigger circuit 270. This trigger circuit then applies a logic level 0 signal to the load input of counter chain 220 causing it to initiate its counting sequence in synchronism with system framing pulse SFPA. Clock synchronization circuit 200 then provides system framing pulse SFPB in the same manner as previously described for clock synchronization circuit 100.

Figure 2:
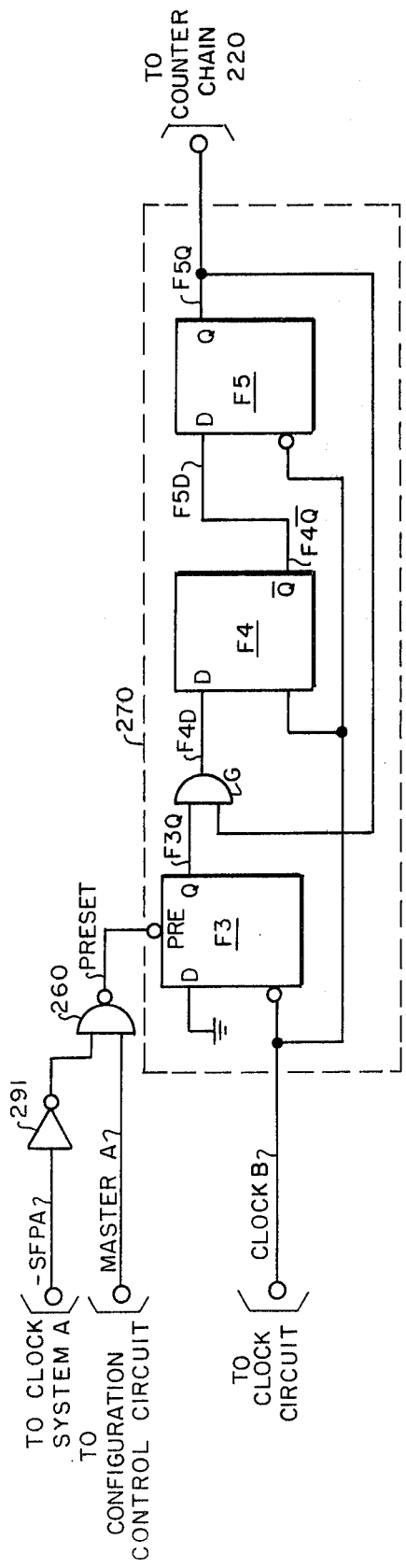
FIG. 2 is a logic diagram of the trigger circuit shown in FIG. 1.

Referring now to FIG. 2 the circuitry of trigger circuit 270 is shown. As previously stated, gate 260 applies a logic level 0 signal to the preset input of trigger circuit 270 in response to a logic level 1 master A signal and a logic level 1 system framing pulse SFPA. This logic level 0 signal from gate 260 is applied to the preset (PRE) input of flip-flop F3 causing it to provide a logic level 1 F3Q signal for the duration of the SFPA signal. The rising edge of the F3Q signal appears simultaneously with the rising edge of the SFPA signal as shown in FIG. 3. When the SFPA signal returns to a logic level 0, a logic level 1 signal is applied to the PRE input of flip-flop F3 and it then provides a logic level 0 F3Q signal on the next negative edge of the CLKB signal since the D input of flip-flop F3 is connected to ground.

Output signal F5Q from flip-flop F5 is normally at a logic level 1. Therefore logic level 1 signals appear at both inputs to gate G thereby causing a logic level 1 F4D signal to appear at the D input of flip-flop F4. When the next positive going edge of a CLKB signal appears at the clock input of flip-flop F4 it provides a logic level 0 F4$\overline{Q}$ signal at its $\overline{Q}$ output because of the logic level 1 signal at its D input. Flip-flop F5 transfers the logic level 0 F4$\overline{Q}$ signal which appears at its D input, to its Q output on the next negative going edge of a CLKB signal. Flip-flop F5 is then clocked a second time in response to the next subsequent negative going edge of the CLKB signal which occurs 80 nanoseconds later. At this time the F4$\overline{Q}$ signal has returned to a logic level 1 because the logic level 0 F5Q signal was fed back to flip-flop F4 via gate G. Therefore the F5Q signal also returns to a logic level 1 signal and it results in an 80 nanosecond negative going pulse since it was clocked on successive negative going CLKB pulses.

The F3Q signal has variable positioning due to the variable location of the SFPA signal. However since the F5Q signal is fed back to gate G it causes F4D signal to return to a logic level 0 when the F5Q signal goes to a logic level 0. This feedback insures that the F5Q signal has an 80 nanosecond pulse width.

The F5Q signal is also applied to the load input of counter chain 220. Thus counter chain 220 initiates its counting sequence in synchronism with system framing pulse SFPA and provides its system framing pulse SFPB within 80 nanoseconds of SFPA.

Thus the clock synchronization system of the present invention provides a means of synchronizing clocks to within 80 nanoseconds of each other without the complex logic circuitry required for phase locked loops.

It will be obvious to those skilled in the art that numerous modifications of the present invention can be made without departing from the spirit of the invention which shall be limited only by the scope of the claims appended hereto.

What is claimed is:

1. A clock synchronization system for use in a switching system including a plurality of clock circuits, each operated to provide periodic clock pulses, and a control circuit operated to exclusively provide a master clock signal for each clock circuit, said clock synchronization system comprising:
   a plurality of clock synchronization circuits each connected to an associated one of said clock circuits, to said control circuit, and to each other clock synchronization circuit, and each operated in response to a predetermined number of said clock pulses from said associated clock circuit and an absence of said master clock signal for each other clock circuit, to provide a timing pulse;
   each clock synchronization circuit further operated in response to said master clock signal for each other clock circuit, said timing pulse from each other clock synchronization circuit and a predetermined number of said clock pulses from said associated clock circuit to provide said timing pulse.

2. A clock synchronization system as claimed in claim 1, wherein there is further included: gating means connected to each clock synchronization circuit and said associated clock circuit, operated to combine said timing pulse with said clock pulses from said associated clock circuit.

3. A clock synchronization system as claimed in claim 2, wherein said gating means comprises an OR gate.

4. A clock synchronization system as claimed in claim 2, wherein each clock synchronization circuit comprises:
   counting means connected to said associated clock circuit, operated to count clock pulses from said associated clock circuit;
   decoding means connected to said counting means, operated in response to a predetermined count of clock pulses from said associated clock circuit to provide a decoder signal; and
   timing means connected to said decoding means, operated in response to said decoder signal and a first following clock pulse edge to initiate said timing pulse, and further operated in response to a second following clock pulse edge to terminate said timing pulse.

5. A clock synchronization system as claimed in claim 4, wherein said timing means comprises: a D-type flip-flop having a data input connected to said decoding means and a clock input connected to said associated clock circuit.

6. A clock synchronization system as claimed in claim 4, wherein each clock synchronization circuit further comprises:
a plurality of triggering means each connected to said control circuit and each other clock synchronization circuit, each operated in response to said master clock signal for each other clock circuit and said timing pulse from each other clock synchronization circuit to provide a clear signal;
said counting means operated in response to said clear signal to initiate counting of clock pulses from said associated clock circuit.

7. A clock synchronization system as claimed in claim 6, wherein said triggering means comprises:
gating means connected to said control circuit and each other clock synchronization circuit, operated in response to said master clock signal for each other clock circuit and said timing pulse from each other clock synchronization circuit to provide a preset signal;
first storage means connected to said gating means operated in response to said preset signal to provide a first storage signal;
second storage means connected to said first storage means and said associated clock circuit operated in response to said first storage signal and a first following clock pulse edge to provide a second storage signal; and
third storage means connected to said second storage means and said associated clock circuit, operated in response to said second storage signal and a second following clock pulse edge to provide a third storage signal.

8. A clock synchronization circuit as claimed in claim 7, wherein said second storage means is further operated in response to said third storage signal and a third following clock pulse edge to inhibit said second storage signal; and
said third storage means is further operated in response to an absence of said second storage signal and a fourth following clock pulse edge to inhibit said third storage signal.

9. A clock synchronization system as claimed in claim 8, wherein said first, second and third storage means comprise first, second and third flip-flops, respectively.

10. A clock synchronization system as claimed in claim 9, wherein said first flip-flop comprises: a D-type flip-flop having a preset input connected to said gating means, a data input connected to ground and a clock input connected to said associated clock circuit.

11. A clock synchronization system as claimed in claim 9, wherein said second flip-flop comprises: and AND gate connected to said first and said third flip-flops, a D-type flip-flop having a data input connected to said AND gate, and a clock input connected to said associated clock circuit.

12. A clock synchronization system as claimed in claim 9, wherein said third flip-flop comprises: a D-type flip-flop having a data input connected to said second flip-flop and a clock input connected to said associated clock circuit.

* * * * *